(12) United States Patent
Baek et al.

(10) Patent No.: US 6,875,704 B2
(45) Date of Patent: Apr. 5, 2005

(54) METHOD FOR FORMING PATTERN USING PRINTING PROCESS

(75) Inventors: Myoung-Kee Baek, Kyonggi-do (KR); Kwon-Shik Park, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/673,190

(22) Filed: Sep. 30, 2003

(65) Prior Publication Data

US 2004/0121614 A1 Jun. 24, 2004

(30) Foreign Application Priority Data

Dec. 18, 2002 (KR) .................................. P2002-081442

(51) Int. Cl.⁷ ..................... H01L 21/302; H01L 21/461
(52) U.S. Cl. ..................... 438/743; 438/691; 438/700; 438/735; 438/778; 438/781; 438/623; 438/624
(58) Field of Search ............................. 438/743, 691, 438/700, 735, 623, 624, 778, 781

(56) References Cited

U.S. PATENT DOCUMENTS

| | | | |
|---|---|---|---|
| 4,294,650 A | | 10/1981 | Werthmann |
| 5,259,926 A | * | 11/1993 | Kuwabara et al. ............ 216/54 |
| 5,514,503 A | | 5/1996 | Evans et al. |
| 5,544,582 A | | 8/1996 | Bocko et al. |
| 5,668,379 A | * | 9/1997 | Ono et al. ..................... 257/59 |
| 5,678,483 A | | 10/1997 | Johnson |
| 5,701,815 A | | 12/1997 | Bocko et al. |
| 5,900,160 A | * | 5/1999 | Whitesides et al. ........... 216/41 |
| 6,001,515 A | | 12/1999 | Evans et al. |
| 6,162,569 A | * | 12/2000 | Nakashima et al. ........... 430/7 |
| 6,356,318 B1 | | 3/2002 | Kawahata |
| 6,518,168 B1 | * | 2/2003 | Clem et al. .................. 438/623 |
| 6,632,536 B2 | * | 10/2003 | Buchwalter et al. ........ 428/447 |
| 2004/0028875 A1 | * | 2/2004 | Van Rijn et al. ............. 428/98 |

FOREIGN PATENT DOCUMENTS

| | | |
|---|---|---|
| EP | 0 471 628 A1 | 2/1992 |
| JP | 63-205608 | 8/1988 |
| JP | 3-280416 | 12/1991 |
| JP | 4-94115 | 3/1992 |
| JP | 4-239684 | 8/1992 |
| JP | 4-249189 | 9/1992 |
| JP | 4-296724 | 10/1992 |
| JP | 5-11270 | 1/1993 |
| JP | 6-202314 | 7/1994 |
| JP | 7-240523 | 9/1995 |

* cited by examiner

*Primary Examiner*—Matthew Smith
*Assistant Examiner*—Igwe U. Anya
(74) *Attorney, Agent, or Firm*—Morgan, Lewis & Bockius LLP

(57) ABSTRACT

A method for forming a pattern using a printing process is disclosed in the present invention. The method includes forming a resist layer on a substrate having an etching layer thereon, locating a master having a convex pattern over the substrate, pressing the master against the substrate until the convex pattern of the master directly contacts the etching layer, and removing a portion of the resist layer to expose a surface over the substrate, the removed portion of the resist layer having a width substantially the same as the convex portion of the master.

10 Claims, 7 Drawing Sheets

METHOD FOR FORMING PATTERN USING PRINTING PROCESS

This application claims the benefit of the Korean Patent Application No. P2002-081442 filed on Dec. 18, 2002, which is hereby incorporated by reference.

BACKGROUND OF THE INVENTION

1. Field of the Invention

The present invention relates to a liquid crystal display device, and more particularly, to a method for forming a pattern in a liquid crystal display device. Although the present invention is suitable for a wide scope of applications, it is particularly suitable for forming a fine pattern and increasing productivity.

2. Discussion of the Related Art

In display devices, particularly in flat panel display devices, pixels are arranged in a matrix form. Among the flat panel devices, liquid crystal display (LCD) devices have active devices, such as thin film transistors (hereinafter, TFTs), which are positioned in respective pixels for driving the pixels in the display devices. Such a method of driving the display device is called an active matrix driving method because the active devices are arranged in the respective pixels aligned in a matrix form.

FIG. 1 is a plane view of a pixel in the related art LCD device using the active matrix method. The active device is a TFT 10. As shown in FIG. 1, a plurality of gate lines 2 arranged horizontally and a plurality of data lines 4 arranged vertically define a pixel. The TFT 10 for independently controlling the driving of the respective pixel is formed near the intersection each of the gate lines and each of the data lines. The TFT 10 includes a gate electrode 2a connected to one of the gate lines 2, a semiconductor 5 formed on the gate electrode 2a, and source and drain electrodes 4a and 4b formed on the semiconductor layer 5. The TFT 10 is activated when a scan signal is applied to the gate electrode 2a by one of the gate lines 2. At the pixel, a pixel electrode 7, which is connected to the drain electrodes 4b, is supplied with an image signal through the source and drain electrodes 4a and 4b, when the semiconductor layer 5 is activated by the gate electrode 2a. The pixel electrode 7 is connected to the drain electrode 4b through a first contact hole 8a. A storage line 6 and a storage electrode 11, which overlaps the storage line 6, are positioned in the pixel defined by the gate line 2 and the data line 4 to form a storage capacitor Cst. The storage electrode 11 is connected to the pixel electrode 7 through a second contact hole 8b.

FIG. 2 is a cross-sectional view taken along line I—I of FIG. 1 illustrating a TFT 10 and a storage capacitor Cst positioned inside the pixel. As shown in FIG. 2, the TFT 10 includes a substrate 1 formed of a transparent insulating material, such as glass, a gate electrode 2a formed on the substrate 1, a gate insulating layer 13 deposited over the entire substrate 1, a semiconductor layer 5 formed on the gate insulating layer 13, source/drain electrodes 4a and 4b formed on the semiconductor layer 5, a passivation layer 15 formed on the source/drain electrodes 4a and 4b to protect the device, and a pixel electrode 7 connected to the drain electrode 4b through the first contact hole 8a.

The storage capacitor Cst includes a storage line 6 formed at the same series of patterning processes as the gate electrode 2a of the TFT, and a storage electrode 11 formed at the same series of patterning processes as the source and drain electrodes 4a and 4b. A gate insulating layer 13 is formed between the storage line 6 and storage electrode 11.

A second contact hole 8b for exposing a portion of the storage electrode 11 is formed in the passivation layer 15. The storage electrode 11 is electrically connected to the pixel electrode 7 through the second contact hole 8b. The storage capacitor Cst charges through a gate voltage while a gate signal is applied to the gate electrode 2a, and then holds charges until the gate electrode 2 is selected in the next frame to prevent the voltage change of the pixel electrode 7. Herein, sizes of the first and second contact holes 8a and 8b for electrically connecting the drain electrode 4b and the storage electrode 11 to the pixel electrode 7 are a few micrometers ($\mu$m), respectively.

The above-described LCD device is fabricated by a photo mask process, and the photo mask process includes a series of processes, such as photoresist application, arrangement and exposure, development, cleaning, etc. More specifically, in the exposure process, processes of disposing the mask on an original position, aligning the mask and the substrate as matching align keys of the mask and the substrate, and radiating a light source are proceeded in order. Herein, it is difficult to form an accurate alignment due to a limitation of the exposing equipment. Therefore, there is a limit in forming a fine pattern requiring a high degree of accuracy, and a plurality of photo processes should be repeated, thereby decreasing the productivity.

SUMMARY OF THE INVENTION

Accordingly, the present invention is directed to a method for forming a pattern using a printing process that substantially obviates one or more of problems due to limitations and disadvantages of the related art.

Another object of the present invention is to provide a method for forming a pattern, which is able to form a pattern on a liquid crystal display device with a single process in a printing method.

Another object of the present invention is to provide a method for forming a pattern, which is able to accurately form a fine pattern such as a passivation contact hole of a liquid crystal display device.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for forming a pattern over a substrate includes forming a resist layer on a substrate having an etching layer thereon, locating a master having a convex pattern over the substrate, pressing the master against the substrate until the convex pattern of the master directly contacts the etching layer, and removing a portion of the resist layer to expose a surface over the substrate, the removed portion of the resist layer having a width substantially the same as the convex portion of the master.

In another aspect of the present invention, a method for forming a pattern over a substrate includes locating a master having a concave portion over a substrate, forming a resist layer on the master except for the concave portion, and transferring the resist layer onto the substrate exposing a portion of a surface over the substrate.

In another aspect of the present invention, a method for forming a pattern over a substrate includes forming an etching layer on a substrate, forming a self-aligned monolayer layer on the etching layer, locating a master having a convex portion over the substrate, pressing the master onto the etching layer until the convex portion directly contacts the substrate, forming a self-aligned monolayer pattern on the etching layer exposing a portion of a surface over the substrate by separating the master from the substrate, wherein the portion of the surface has a width substantially the same as the convex portion, and etching the etching layer using the self-aligned monolayer pattern as a mask.

In a further aspect of the present invention, a method for forming a pattern over a substrate includes forming an etching layer on a substrate, locating a master having a concave portion over the substrate, wherein the concave portion corresponds to a portion of the etching object layer to be etched, forming a self-aligned monolayer layer on the master except for the concave portion, forming a self-aligned monolayer pattern on the etching layer by transferring the self-aligned monolayer layer formed on the master onto the etching layer, and etching the etching layer using the self-aligned monolayer pattern as a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
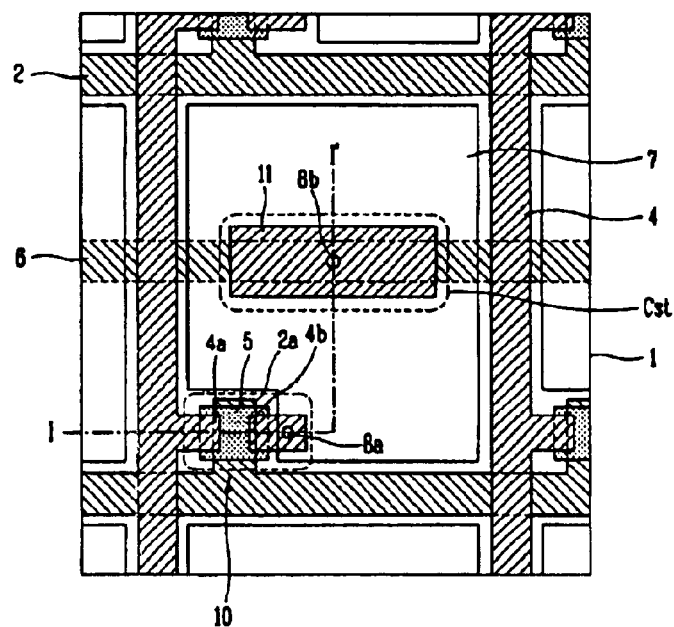
FIG. 1 is a plane view illustrating a structure of the related art liquid crystal display device.
Figure 2:
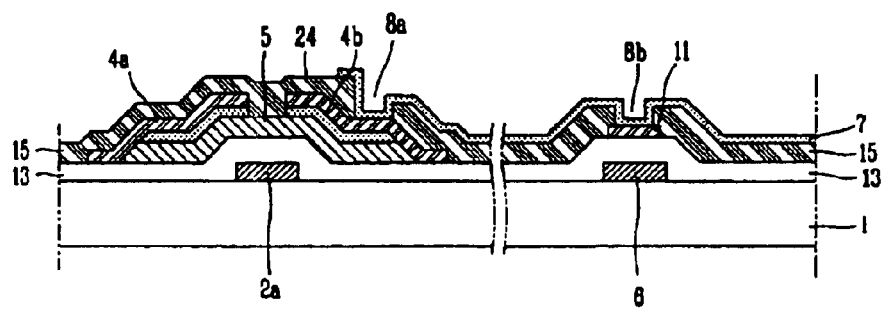
FIG. 2 is a cross-sectional view taken along line I—I of FIG. 1 illustrating structures of a thin film transistor and a storage capacitor of the liquid crystal display device shown in FIG. 1.
Figure 3A:
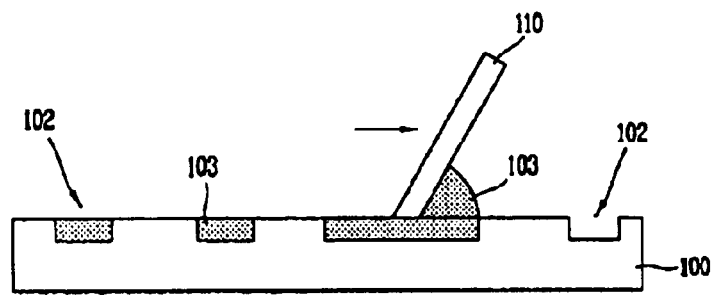
FIGS. 3A to 3C are cross-sectional views illustrating a method for forming a pattern using a printing method according to the present invention.
Figure 3B:
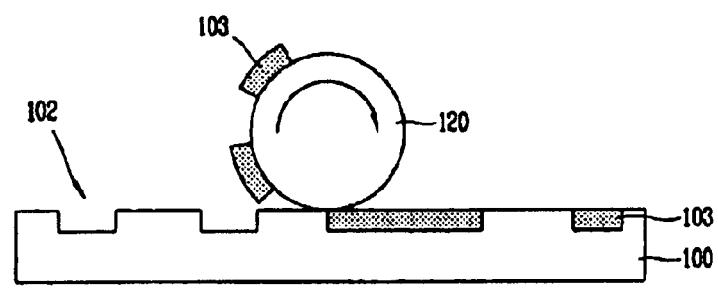
Figure 3C:
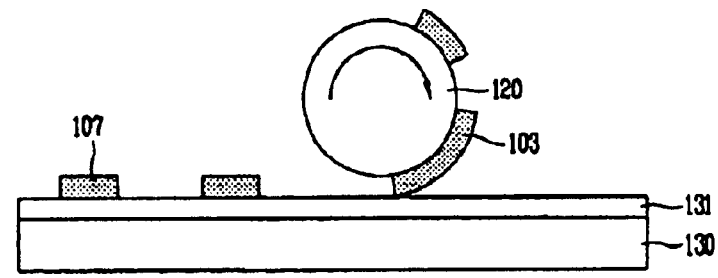

FIGS. 3A to 3C are cross-sectional views illustrating a resist pattern forming method in a liquid crystal display device through a printing method in accordance with the present invention.

With reference to FIG. 3A, a cliché 100 with a concave groove 102 formed at a position corresponding to a pattern desired to be formed on a substrate is prepared. A resist 103 is deposited on the surface of the substrate 100. A doctor blade 110 may be used to planarize the surface of the cliché 100, to push the resist into the grooves 102, and to remove the resist 103 from the surface of the cliché 100. Thus, the resist 103 is filled in the groove 102 while the resist remaining on the surface of the cliché 100 is removed.

As illustrated in FIG. 3B, the resist 103 filled in the groove 102 of the cliché 100 is transferred to the surface of the printing roll 120 that is rotated in contact with the surface of the cliché 100. The printing roll 120 is formed with the same width as the panel of a display device to be fabricated and has the circumference substantially the same as the length of the panel. Accordingly, the resist 103 filled in the groove 102 of the cliché 100 is transferred onto the printing roll 120.

Thereafter, as illustrated in FIG. 3C, to transfer the resist 103 on the printing roll 120 to the surface of the etching layer 131 formed on the substrate 130, the printing roll 120 is rotated in close proximity or in contact with the etching layer 131. Thus, the resist 103 transferred on the printing roll 120 is applied to the etching layer 131. Then, the applied resist is UV-irradiated or heated to dry in forming a resist pattern 107. Accordingly, at this time, a desired resist pattern 107 can be formed over the entire etching layer 131 by rotating the printing roll 120 once over the surface of the etching layer 131.

The etching layer 131 can be a metal layer for forming a metal pattern such as a gate electrode or a source/drain electrodes of a thin film transistor, a gate line, a data line or a pixel electrode and a storage electrode, or a semiconductor layer. The etching layer 131 can be an insulation layer such as SiOx or SiNx, or any material desired to be patterned using a resist.

After the resist pattern 107 is formed on the etching layer 131 such as a metal layer or an insulation layer, the etching layer is etched through a common etching process, thereby forming a desired patterned layer. That is, in the case of a metal layer, e.g., a gate line, a data line, and an electrode structure of the thin film transistor, or in the case of an insulation layer, e.g., a contact hole, etc. or a desired pattern.

The above-described printing method is advantageous in that the resist pattern can be generated through a one time process. The process is simple, and the process time can be shortened compared to the photomasking process.

However, in such a printing method, a defective pattern can be generated in forming a fine pattern (in the order of microns), such as a contact hole. That is, as mentioned above in the discussion of the related art, the contact hole is formed at the upper portion of the thin film transistor, exposing a portion of the drain electrode and the storage electrode of the thin film transistor, and the pixel electrode formed on the passivation layer is electrically connected to the drain electrode and the storage electrode through the contact hole. However, since the contact hole has a size of a few micrometers ($\mu$m), it is difficult to form an accurate pattern.

Figure 4:
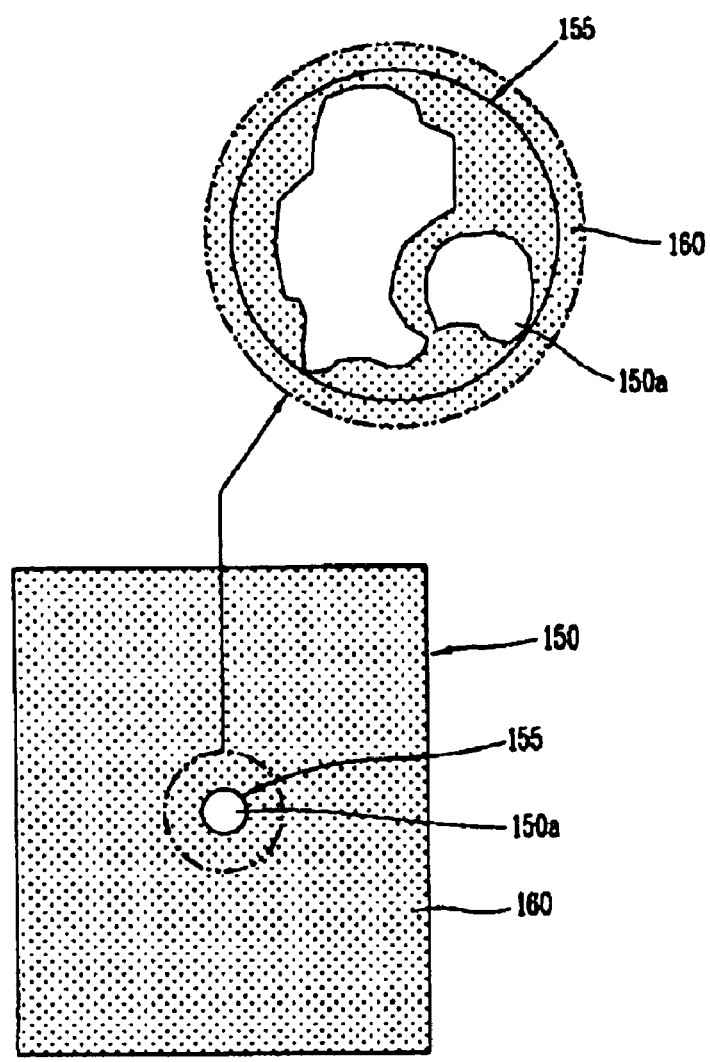
FIG. 4 is a plane view showing an incompletely etched contact hole when a layer to be etched is a passivation layer.

In order to form a contact hole, as illustrated in FIG. 4, a resist 160 must be formed on the passivation layer 150 except for the contact hole region 155. Using the resist 160 as a mask, the exposed passivation layer 150a is etched to form a contact hole. In accordance with the present invention, the resist 160 is formed simultaneously when the printing roll (not shown) is rotated on the passivation layer. The printing roll may apply some pressure to the passivation layer. However, in case of forming a fine pattern such as a contact hole, the applied pressure causes a part of the resist 160 to spread into the contact hole region 155, as illustrated in the enlarged view. In the worst case, the contact hole region 155 may be filled with the resist 160.

With the poorly formed contact hole pattern, the passivation layer cannot be properly etched. Then, the pixel electrode may not properly contact the drain electrode and the storage electrode, causing an increase in the contact resistance, resulting in a problem in driving the thin film transistor, and degradation of the picture quality.

Therefore, the present invention is to provide a printing process which is able to form a fine pattern such as a contact hole.

In the printing process according to the present invention, a self-aligned monolayer (SAM) of tens of angstroms (Å) thickness is formed on the substrate on which the passivation layer is formed, and then, physical pressure is applied to the SAM layer using a pre-fabricated master to form a selectively remaining SAM pattern on the passivation layer. Then, a part of the passivation layer is etched using the SAM pattern as a mask to form a contact hole.

Figure 5A:
FIGS. 5A to 5E are cross-sectional views showing the process for forming a contact hole using a micro contact printing method according to the present invention.

FIGS. 5A to 5E illustrate a method for forming a contact hole using the above micro printing process according to the present invention. As shown in FIG. 5A, a SAM layer 210 is evenly formed on a passivation layer 205 formed on a substrate 200. Metal patterns (not shown) such as source/drain electrodes and a storage electrode are already formed on the substrate 200. The SAM layer 210 having a thickness of tens of angstroms (Å) is formed on the passivation layer 205 by dipping the passivation layer in an ethanol vessel in which SAM molecules are dissolved.

Figure 6:
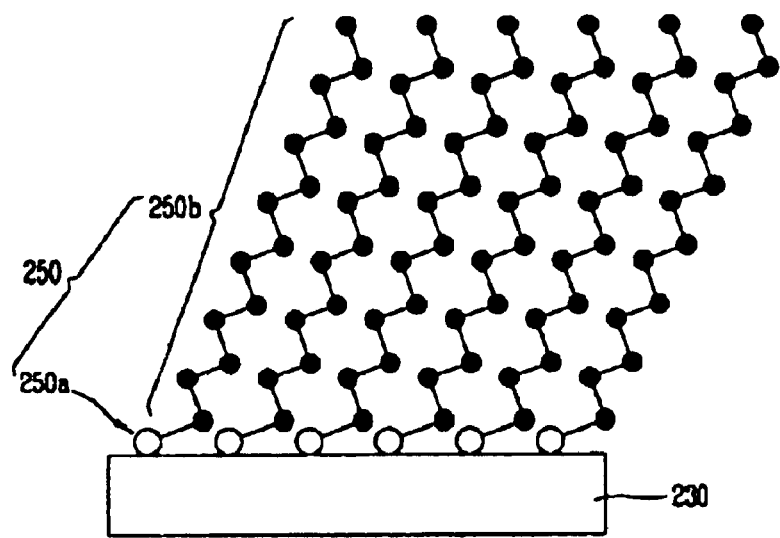
FIG. 6 is a schematic view showing a structure of a self-aligned monolayer (SAM)

FIG. 6 illustrates the SAM layer 250 formed on a Au or $SiO_2$ layer 230. As shown therein, the SAM 250 is divided into a head 250a and a tail 250b. The head 250a is mounted on the substrate 230, and the tail 250b is continuously formed to be connected to the head 250a. The SAM layer 250 can be easily formed on the Au or $SiO_2$ layer. Therefore, it is advantageous that an inorganic material such as $SiO_2$ may be used as a passivation layer for forming the SAM layer.

Figure 5B:
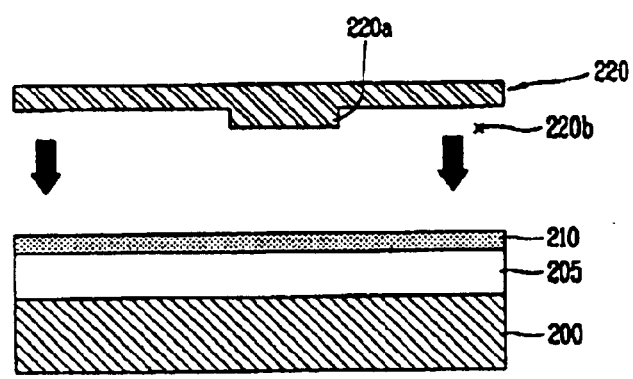
Figure 5C:
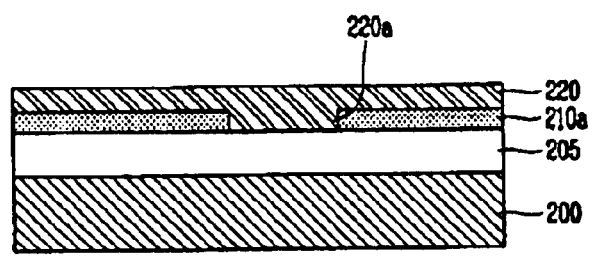

After forming the SAM layer 210 on the passivation layer 205 through the above process, a master 220 having a convex portion 220a and a concave portion 220b is prepared as shown in FIGS. 5B and 5C. Then, the master 220 is contacted and compressed to the SAM layer 210. In this process, a pressure must be applied until the convex portion 220a of the master 220 is contacted to the passivation layer 205. If the applied pressure to the master 220 is too high, the passivation layer 205 may be damaged by the master 220.

Figure 5D:
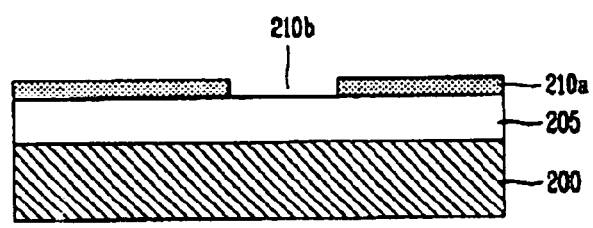
Figure 5E:
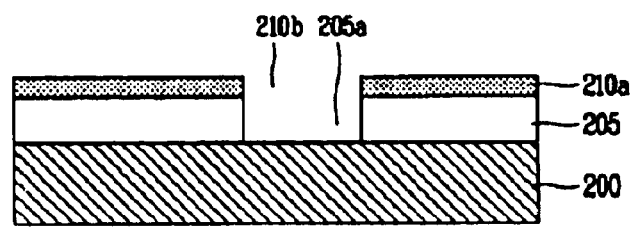

Next, as shown in FIG. 5D, when the master 220 is separated from the substrate 200, a selectively remaining SAM pattern 210a on the passivation layer 205 is formed. An opening 210b corresponding to the convex portion 220a of the master 220 is a removed area of the SAM pattern 210a where a contact hole will be formed later. The SAM pattern 210a formed on the concave portion 220b of the master 220 is used as a mask for forming a contact hole. An accurate contact hole can be formed when the boundary of the SAM pattern 210a for forming the contact hole 205a is apparent and the passivation layer 205 is etched by using the SAM pattern 210a as a mask. Accordingly, the contact failure between the drain and storage electrodes and the pixel electrode can be prevented, so that the thin film transistor can be driven normally.

As another embodiment of the present invention, the SAM may be formed on the convex portion of the master instead of forming the SAM direction onto the substrate. Then, the SAM is printed on the substrate to form the SAM pattern on the substrate.

Figure 7A:
FIGS. 7A to 7E are cross-sectional views showing the process for forming a contact hole using the micro contact printing method, where a SAM layer is formed directly on a master and directly printed onto a substrate.
Figure 7B:
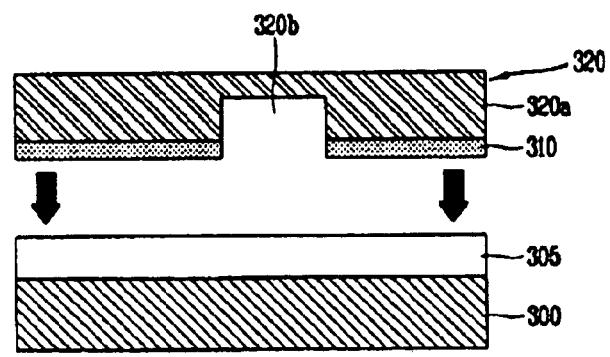
Figure 7C:
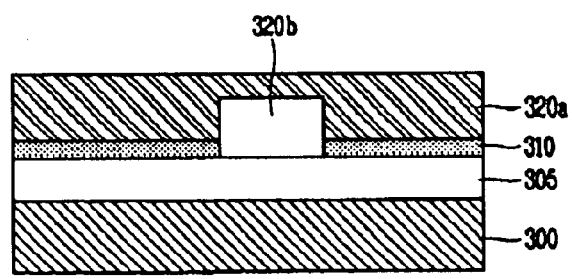
Figure 7D:
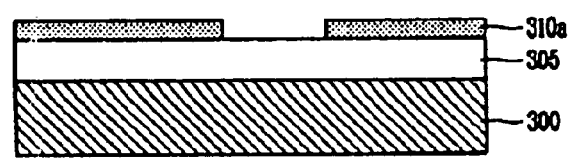
Figure 7E:
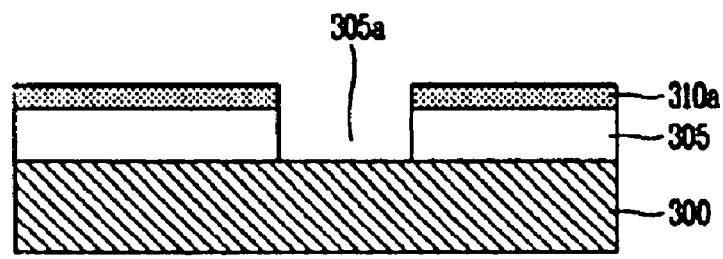

FIGS. 7A to 7E are cross-sectional views showing the process of applying the SAM on the master and printing the SAM on the substrate. First, an inorganic material such as SiOx is deposited on a substrate 300 to form a passivation layer 305, as shown in FIG. 7A. Then, as shown in FIG. 7B, the master having a convex portion 320a and a concave portion 320b is prepared, the master 320 is dipped into an ethanol solution in which SAM molecules are dissolved. Thereafter, a SAM layer 310 of tens of angstroms (Å) thickness is formed on the surface of the convex portion 320a. As shown in FIGS. 7C and 7D, the SAM layer 310 formed on the convex portion 320a of the master 320 is contacted to the passivation layer 305. The master 320 is then separated from the passivation layer 305. Then, the SAM layer 310 formed on the master 320 is transferred onto the passivation layer 305 to form the SAM pattern 310a remaining on the passivation layer 305. In this process, the SAM pattern 310a is formed on the area corresponding to the convex portion 320a of the master 320. The passivation layer 305 is exposed on the area corresponding to the concave portion 320b of the master 320. A width of the exposed passivation layer 305 is a few micrometers ($\mu$m). In FIG. 7E, the exposed passivation layer 305 is etched by using the SAM pattern 310a as a mask, so that the contact hole 305a exposes metal patterns, such as a drain electrode, a storage electrode, etc.

The contact hole formed on the passivation layer includes a gate pad contact hole and a data pad contact hole formed on the ends of the gate line and the data line for connecting to an external circuit, except for exposing a drain electrode and a storage electrode. Therefore, in order for a liquid crystal display device to receive an external signal properly, the contact hole must be formed without any defect.

As described above, according to the present invention, the micro contact printing process using the SAM layer is used to form a fine pattern of a few micrometers ($\mu$m) such as the contact hole in the liquid crystal display device. Thus, the present invention provides a desired pattern and prevents the malfunction of the liquid crystal display device.

It will be apparent to those skilled in the art that various modifications and variations can be made in the method for forming the pattern using the printing process of the present invention without departing from the spirit or scope of the inventions. Thus, it is intended that the present invention covers the modifications and variations of this invention provided they come within the scope of the appended claims and their equivalents.

What is claimed is:

1. A method for forming a pattern over a substrate, comprising:

forming a self-aligned monolayer SAM layer on a substrate having an etching layer thereon;

locating a master having a convex pattern over the substrate;

pressing the master against the substrate until the convex pattern of the master directly contacts the etching layer;

forming a self-aligned monolayer pattern on the etching layer exposing a portion of a surface over the substrate by separating the master from the substrate, wherein the portion of the surface has a width substantially the same as the convex portion of the master; and etching the etching layer using the self-aligned monolayer pattern as a mask.

2. The method of claim 1, wherein the removing a portion of the SAM layer is performed by separating the master from the substrate.

3. The method of claim 1, further comprising:

forming a gate electrode and a gate line on a substrate;

forming a gate insulating layer on the gate electrode and the gate line;

forming a semiconductor layer on the gate insulating layer;

forming source/drain electrodes and a data line on the semiconductor layer; and forming a passivation layer on the substrate.

4. The method of claim 1, wherein the SAM layer is formed of a self-aligned monolayer material.

5. The method of claim 4, wherein the forming of a SAM layer comprises:

dissolving self-aligned monolayer molecules in ethanol;

dipping the substrate into the self-aligned monolayer molecules dissolved ethanol.

6. The method of claim 4, wherein the SAM layer has a thickness of tens of angstroms (Å).

7. The method of claim 6, wherein the insulating layer is one of SiOx or SiNx.

8. The method of claim 1, wherein the etching layer is an insulating layer.

9. The method of claim 1, wherein the etching layer is a semiconductor layer.

10. The method of claim 1, wherein the etching layer is a metal layer.

* * * * *